United States Patent
Lundy et al.

(10) Patent No.: US 7,207,520 B2
(45) Date of Patent: Apr. 24, 2007

(54) SYSTEM, METHOD, AND APPARATUS FOR DESIGNING STREAMLINE TRACED, MIXED COMPRESSION INLETS FOR AIRCRAFT ENGINES

(75) Inventors: Brian F. Lundy, Arlington, TX (US); John D. Klinge, Fort Worth, TX (US); Bradley C. Leland, Burleson, TX (US)

(73) Assignee: Lockheed Martin Corporation, Bethesda, MD (US)

( * ) Notice: Subject to any disclaimer, the term of this patent is extended or adjusted under 35 U.S.C. 154(b) by 0 days.

(21) Appl. No.: 11/140,800

(22) Filed: May 31, 2005

(65) Prior Publication Data

US 2006/0266412 A1 Nov. 30, 2006

(51) Int. Cl.
*B64D 33/02* (2006.01)
(52) U.S. Cl. .................... 244/53 B; 137/15.2
(58) Field of Classification Search ............. 244/53 B; 137/15.1, 15.2
See application file for complete search history.

(56) References Cited

U.S. PATENT DOCUMENTS

| | | | | |
|---|---|---|---|---|
| 2,990,142 A | * | 6/1961 | Ferri | 244/53 B |
| 3,417,767 A | * | 12/1968 | Young | 137/15.2 |
| 3,450,141 A | * | 6/1969 | Braendlein | 137/15.2 |
| 5,078,341 A | * | 1/1992 | Bichler et al. | 244/53 B |
| 5,749,542 A | | 5/1998 | Hamstra et al. | 244/53 B |
| 5,779,189 A | | 7/1998 | Hamstra et al. | 244/53 B |
| 6,164,596 A | * | 12/2000 | Kothari | 244/171.1 |
| 6,793,175 B1 | * | 9/2004 | Sanders et al. | 244/53 B |

OTHER PUBLICATIONS

"computational fluid dynamis laboratory supersonic flow through a . . ." 1999☐☐www.engr.iupui.edu/cfdlab/research/presentation/1999/supersonic3Dinlet.pdf☐☐4 pages.*
"Parallel Computational Fluid Dynamics" A. Ecer et al, 1995.*
*Boundary-Layer Correction for the Busemann Hypersonic Air Inlet*, P.C. Walsh, et al., vol. 49, No. 1, Mar. 2003, pp. 11-17 of Can Aeronaut Space J; Canadian Aeronautics and Space Journal.
*Design and Analysis of Streamline Traced Hypersonic Inlets*, F.S. Billig, et al., 1999, pp. 1-18 of 9th International Space Planes and Hypersonic Systems and Technologies Conference and 3rd Weakly Ionized Gases Workshop Nov. 1-5, 1999/Norfolk, VA.

(Continued)

*Primary Examiner*—Galen Barefoot
(74) *Attorney, Agent, or Firm*—Bracewell & Giuliani LLP (57) ABSTRACT

An advanced aperture inlet (AAI) uses a three-dimensional, mixed compression inlet design derived from computational fluid dynamics (CFD) by streamline tracing a supersonic section from an axisymmetric mixed compression inlet solution. The axisymmetric design is used to obtain a CFD solution with slip wall boundaries at the inlet design point and serves as a flow field generator for the AAI. The AAI geometry is obtained by projecting a desired aperture shape onto a surface model of the external oblique shock. Streamline seeds are located on the projected aperture segments and transferred into the CFD solution space. The streamlines generated by these seeds inside the CFD solution space are then used as a wireframe to define the supersonic diffuser back to the throat location. Traditional design techniques are then used to define the subsonic diffuser from the inlet throat to the engine face.

10 Claims, 6 Drawing Sheets

OTHER PUBLICATIONS

*Streamline Tracing: Technique for Designing Hypersonic Vehicles,* Frederick S. Billig, et al., vol. 16, No. 3, May, 2000 (May 2000), pp. 467-471 of Journal of Propulsion and Power, American Institute of Aeronautics and Astronautics, New York.

*Design of Three-Dimensional Hypersonic Inlets With Rectangular-to-Elliptical Shape Transition,* M.K. Smart, vol. 15, No. 3, May 1999 (May 1999), pp. 408-416 of Journal of Propulsion and Power, American Institute of Aeronautics and Astronautics, New York.

*Comparison of Planar and Axisymmetric Flowpaths for Hydrogen Fueled Space Access Vehicles,* F.S. Billig, et al., pp. 1-12 of 39th AIAA/ASME/SAE/ASEE Joint Propulsion Conference and Exhibit, Jul. 20-23, 2003/Huntsville, AL.

* cited by examiner

SYSTEM, METHOD, AND APPARATUS FOR DESIGNING STREAMLINE TRACED, MIXED COMPRESSION INLETS FOR AIRCRAFT ENGINES

BACKGROUND OF THE INVENTION

1. Technical Field

The present invention relates in general to inlet design for aircraft engines and, in particular, to an improved system, method, and apparatus for designing streamline traced, mixed compression inlets for high speed aircraft engine applications.

2. Description of the Related Art

Air inlet systems for gas turbine powered supersonic aircraft are required to decelerate the approaching flow to subsonic conditions prior to the engine face. Supersonically, this can be done through shock waves or isentropic compression generated externally, internally, or by a mixture of both. Fixed geometry external compression inlets have typically been used for aircraft (e.g., the F-16 and F-18) designed for short excursions to supersonic conditions, due to the relative simplicity and light weight of these designs. Aircraft capable of higher speeds, such as the F-14 and F-15, have employed variable geometry external compression inlets to obtain better engine and inlet airflow matching at low speeds, and higher performance at supersonic speeds.

High altitude supersonic cruise aircraft typically require maximum efficiency at the cruise point to obtain optimum range and payload. At speeds above Mach 2, mixed compression inlet systems become favorable over external compression systems due to reduced drag. Mixed compression inlets have been demonstrated in flight on aircraft such as the A-12, SR-71, D-21, and XB-70. Several other designs have been tested over the past 50 years. All of these mixed compression designs were based on either axisymmetric or two-dimensional compression schemes in order to minimize shock interactions caused by complex, three-dimensional geometry. However, increasing demand for more integrated inlet and airframe concepts has resulted in the need for more exotic inlet aperture shapes. Thus, although present designs and systems are workable, an improved solution would be desirable.

SUMMARY OF THE INVENTION

One embodiment of a system, method, and apparatus for an advanced aperture inlet (AAI) is a three-dimensional, mixed compression inlet design concept derived from computational fluid dynamics (CFD) by streamline tracing the supersonic section from a mixed compression axisymmetric inlet solution. The axisymmetric design is used to obtain a CFD solution with slip wall boundaries at the inlet design point and serves as a "flow field generator" for the AAI. Exotic, three-dimensional aperture shapes are then obtained by tracing particle streamlines from the existing axisymmetric or two-dimensional mixed compression inlet CFD solutions.

A high speed cruise inlet is typically designed such that the oblique shock produced by the external compression portion of the inlet lies on or near the inlet cowl lip at the cruise point. This minimizes the amount of air "spilled" by the inlet. In one embodiment, the first step to obtain an AAI geometry is to project a desired aperture shape onto a surface model of the external oblique shock expected at the cruise Mach number. Streamline seeds are then positioned along the projected aperture segments and transferred to the flow field generator CFD solution space. The streamlines generated by these seeds in the CFD solution define the resultant three-dimensional wireframe of the supersonic diffuser from the aperture to the throat fuselage station. Traditional design techniques are then used to define the subsonic diffuser from the inlet throat to the engine face.

The present technique allows for the design of edge-aligned, swept aperture shapes without incurring the aerodynamic penalties typically encountered with such designs. By producing a design from the desired solution, the performance is easily predicted using simple one-dimensional methods. Moreover, because the design is based on an axisymmetric inlet, the cowl angles are relatively shallow, allowing for low drag integration. The AAI has been computationally proven through CFD to produce uniform flow at the throat with the predicted terminal Mach number.

The foregoing and other objects and advantages of the present invention will be apparent to those skilled in the art, in view of the following detailed description of the present invention, taken in conjunction with the appended claims and the accompanying drawings.

BRIEF DESCRIPTION OF THE DRAWINGS

So that the manner in which the features and advantages of the invention, as well as others which will become apparent are attained and can be understood in more detail, more particular description of the invention briefly summarized above may be had by reference to the embodiment thereof which is illustrated in the appended drawings, which drawings form a part of this specification. It is to be noted, however, that the drawings illustrate only an embodiment of the invention and therefore are not to be considered limiting of its scope as the invention may admit to other equally effective embodiments.

DETAILED DESCRIPTION OF THE INVENTION

Conventional mixed compression inlet designs have been either two-dimensional (e.g., as in the XB-70 aircraft) or axisymmetric (e.g., as in the SR-71 and SST aircraft). In contrast, the present invention uses highly integrated, three-dimensional, non-axisymmetric, mixed compression inlet concepts with tailored apertures. The streamline tracing of the supersonic diffuser section of the present invention allows for alternate aperture shaping to be employed while producing easily understood and predictable mixed compression inlet performance on design. Without this technique, three-dimensionally shaped mixed compression inlets would require intricately designed, discretely customized compression systems and analysis techniques to predict their performance.

Referring to FIGS. 1–8, one embodiment of a system, apparatus, and method of designing a three-dimensional, mixed compression inlet for an aircraft engine is shown. The present invention is particularly well suited for developing non-axisymmetric inlets and apertures for high speed (e.g., Mach 2+) aircraft.

Figure 1:
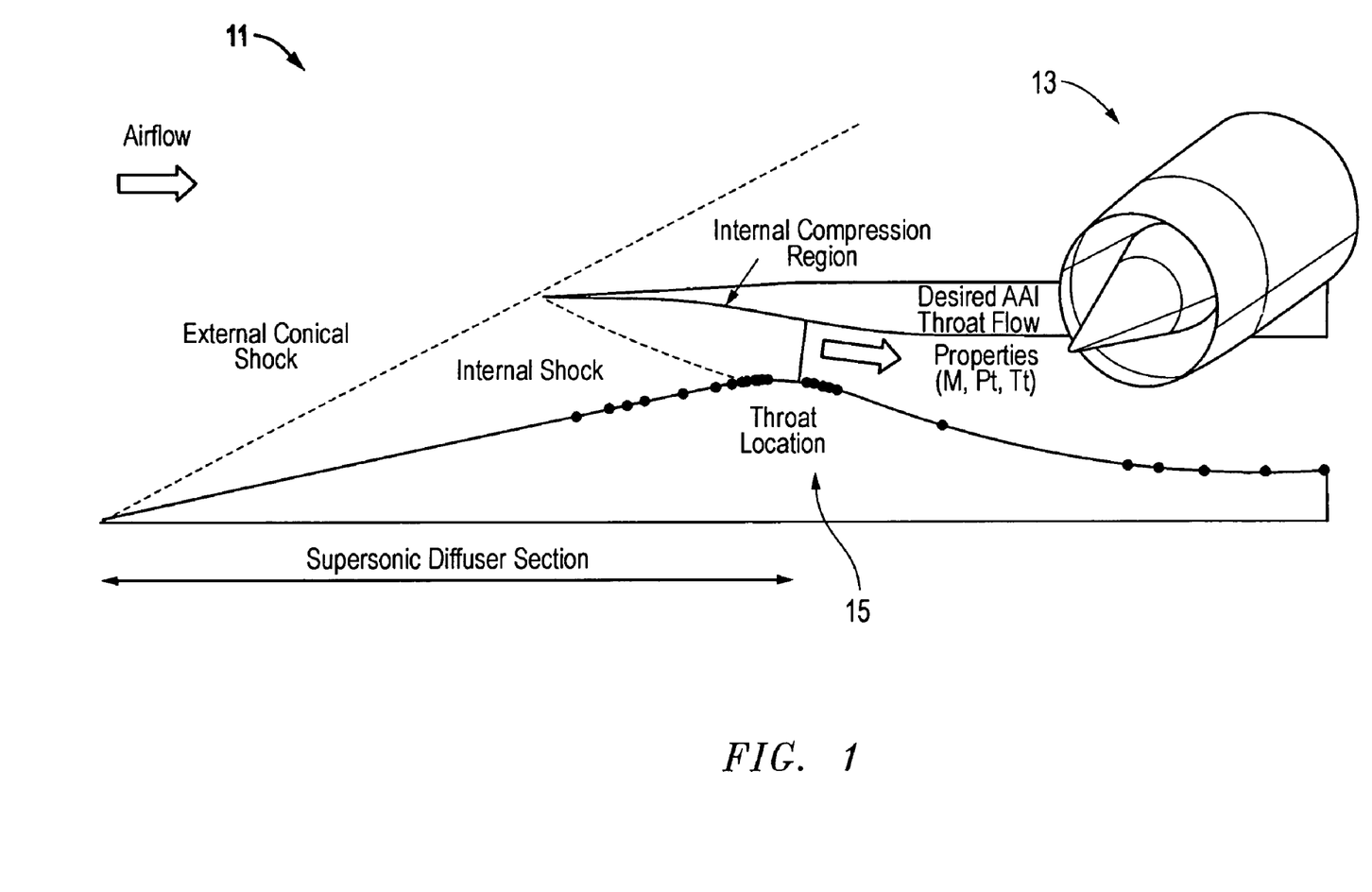
FIG. 1 is a schematic side view of one embodiment of a system and method constructed in accordance with the present invention.
Figure 2:
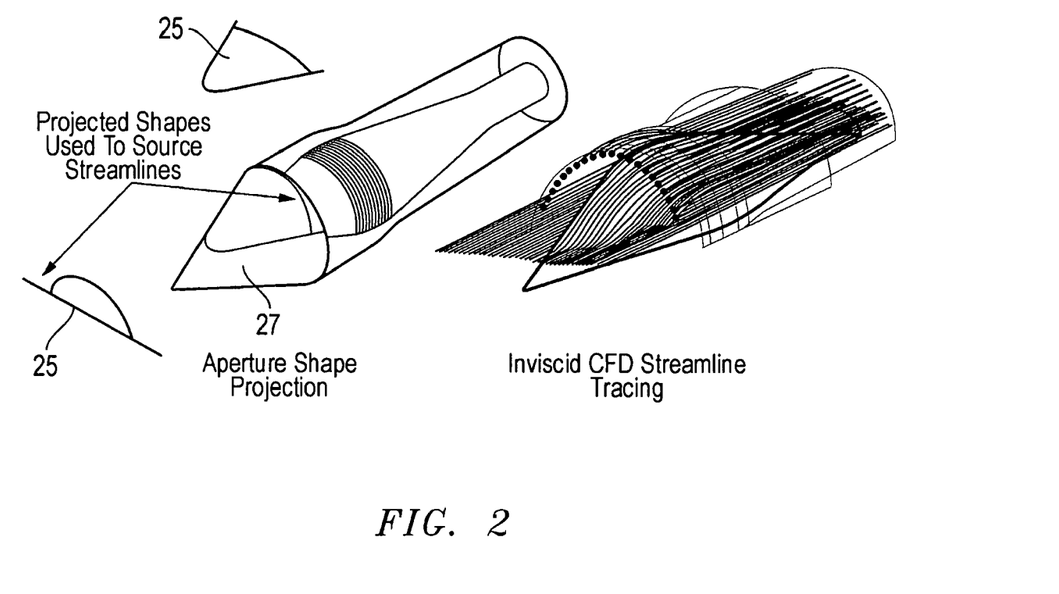
FIG. 2 is an isometric view of an operation of the system and method of FIG. 1 and is constructed in accordance with the present invention.

As shown in FIG. 1, a flowfield generator 13 is developed by initially using or forming an axisymmetric, mixed compression inlet 2D layout 11. The flowfield generator 13 serves as the source inlet from which the lines for the resultant inlet will be derived. Flowfield generator 13 is the 3D result of the 2D design shown as layout 11. The desired supersonic diffuser characteristics and terminal shock Mach number are specified as a design condition that is produced by the flowfield generator 13. The smallest internal area in the inlet, or throat 15, serves as the termination point for the inlet design. Thus, the flowfield generator 13 is designed to produce the desired flow conditions at this location. In one embodiment a corresponding computational fluid dynamics (CFD) solution is obtained at the desired flight conditions with slip wall boundaries.

Figure 3:
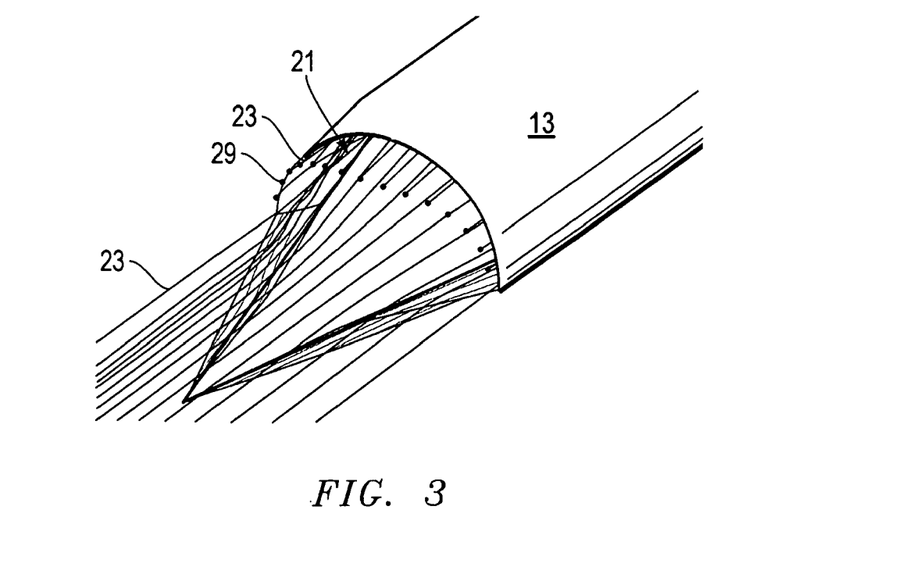
FIG. 3 is an isometric view of an operation of the system and method of FIG. 2 and is constructed in accordance with the present invention.
Figure 4:
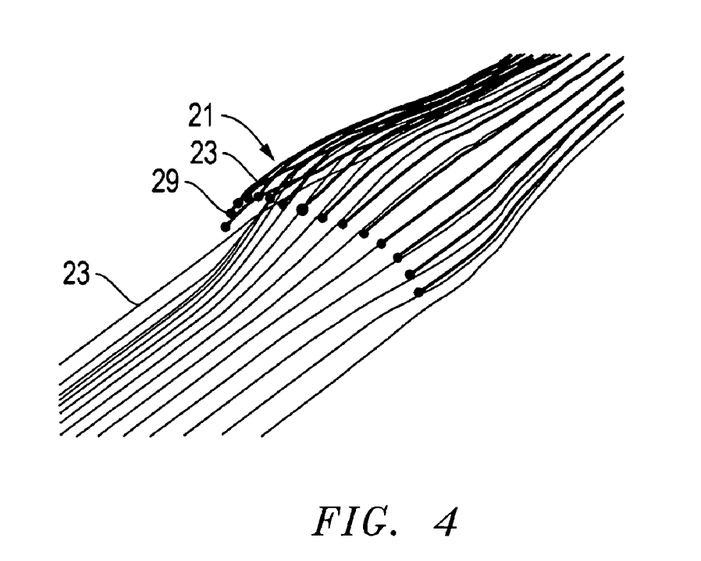
FIG. 4 is an isometric view of an operation of the system and method of FIG. 3 and is constructed in accordance with the present invention.

Referring now to FIG. 3, supersonic diffuser lines 21 are developed for the inlet with streamlines 23. A desired aperture shape 25 (FIG. 2) is projected onto an external conical shock wave 27. This shape provides the location for the streamline sources or "seeds." The streamlines 23 are formed from points 29 along a projection of the aperture. Both cowl and bump surfaces of the supersonic diffuser are formed from streamline seeds, as shown from the intersection lines of shock wave 27. In one embodiment, a Full Navier-Stokes (FNS) CFD solution with slip walls is obtained from the flowfield generator geometry at the inlet design condition. Streamlines are then obtained from the flowfield generator CFD solution using, for example, a post-processing software tool.

Figure 5:
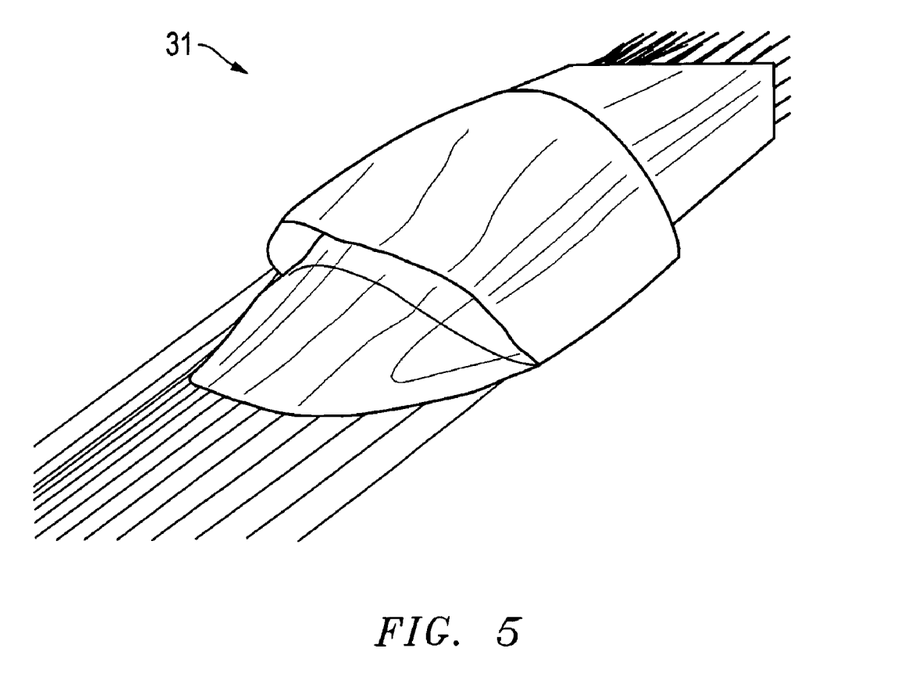
FIG. 5 is an isometric view of an operation of the system and method of FIG. 4 and is constructed in accordance with the present invention.
Figure 6:
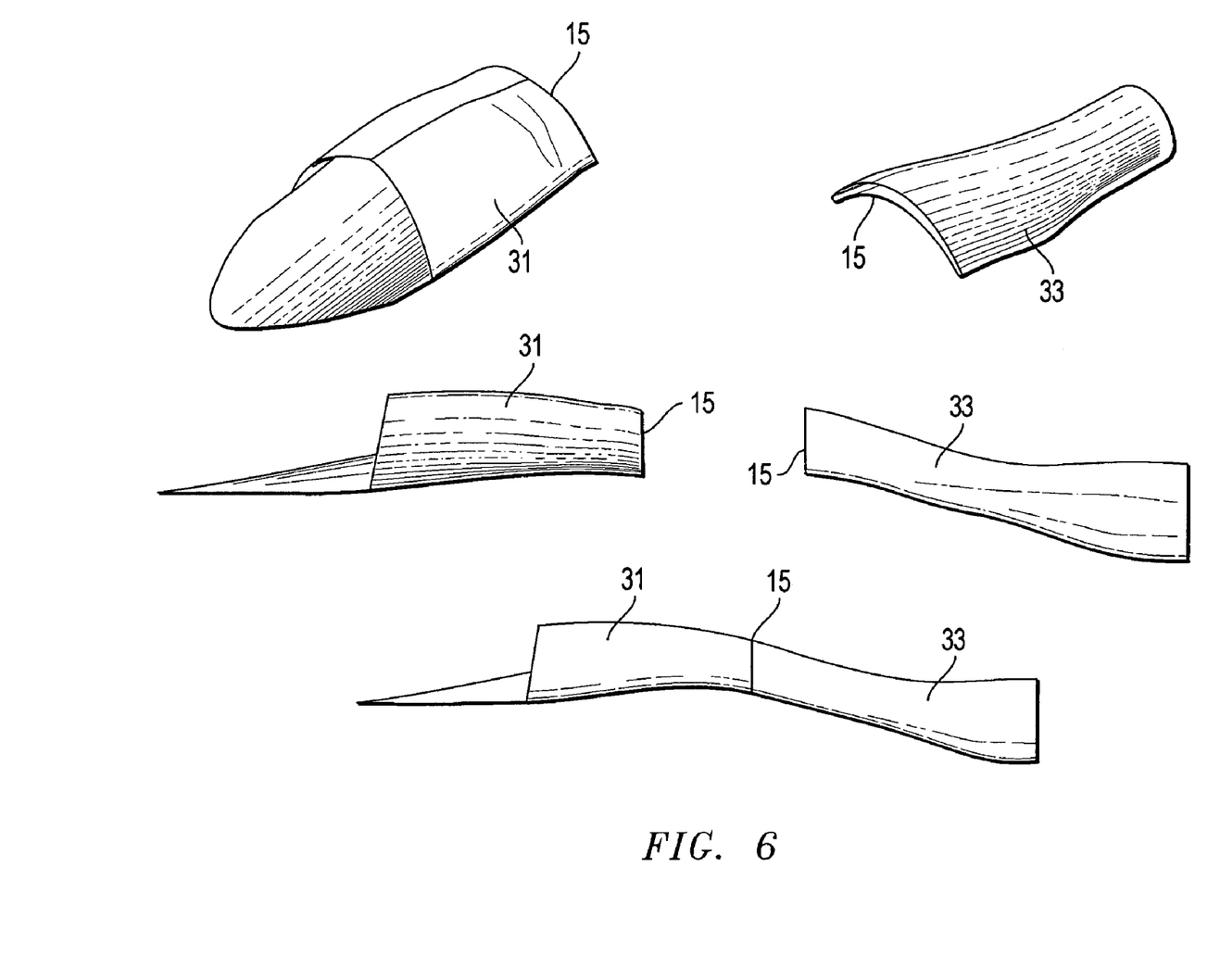
FIG. 6 is an isometric view of an operation of the system and method of FIG. 5 and is constructed in accordance with the present invention.

As shown in FIGS. 3–6, the streamlines 23 are converted to inlet surfaces by, for example, converting the CFD streamline traces. The supersonic diffuser 31 (FIG. 6) is defined with the streamlines 23 from the throat 15 (see FIG. 1) of the flowfield generator 13 forward (to the left) to an aperture of the inlet, and by the cowl (upper surface) and compression surface (lower surface) streamlines. These streamlines are extracted from the CFD solution to serve as a wireframe or skeleton of the new supersonic diffuser (FIG. 5). Traditional design techniques are then used to loft surfaces over the wireframe streamlines to form a complete supersonic diffuser (FIG. 6). The resultant surfaces are then trimmed at the inlet throat location.

Figure 7:
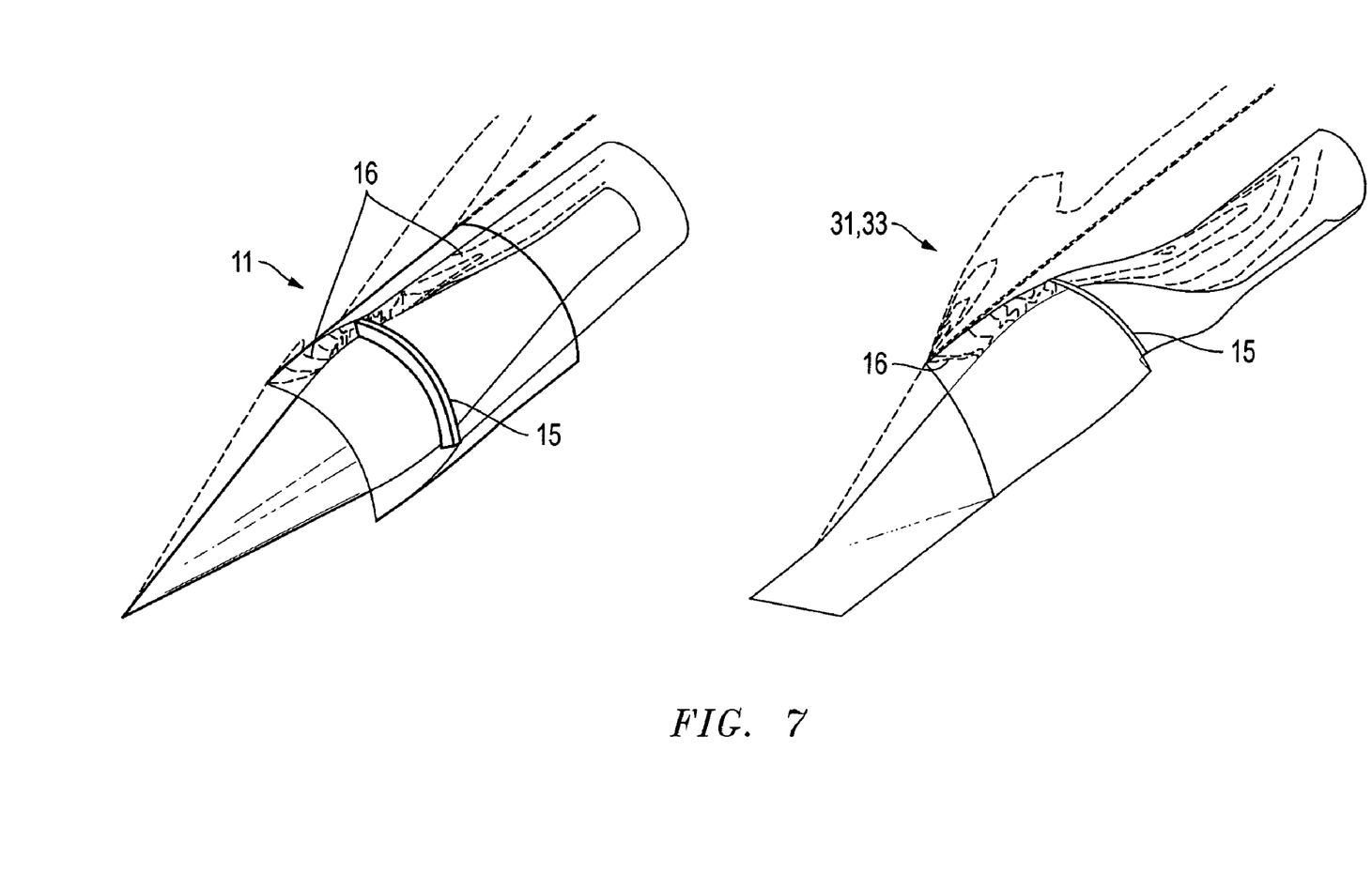
FIG. 7 is an isometric view of an operation of the system and method of FIG. 6 and is constructed in accordance with the present invention.

Using traditional design techniques, a subsonic diffuser 33 is also integrated with the supersonic diffuser 31 to transition from the throat area 15 to the circular engine face area (FIG. 7). The streamline-defined surfaces are then modified to improve surface continuity and smoothness.

Finally, the resultant geometry is assessed at the design condition using, for example, CFD with slip wall boundaries to evaluate the final design. The characteristics or metrics of the supersonic diffuser 31 (e.g., flow uniformity, minimum Mach number (to establish terminal shock), total pressure, etc.) are then compared with those of the flowfield generator 11, which should be similar. In one embodiment (FIG. 7), a comparison is made between the resultant streamline traced geometry and source flowfield generator at the design condition using CFD. Contour lines of Mach number illustrate the similarity in the flow characteristics of the streamline traced inlet relative to the flowfield generator at its design condition. The throat Mach number in both cases is around 1.4.

Although the design of the inlet system is incomplete at this stage, it is equivalent to a conceptual design level inlet. Details such as a bleed system, cowl integration, variable geometry, mechanics, and the like are integrated afterward. However, the present invention is important because it covers the conceptual design space to include a multitude of complex, 3D-shaped mixed compression inlets.

Figure 8:
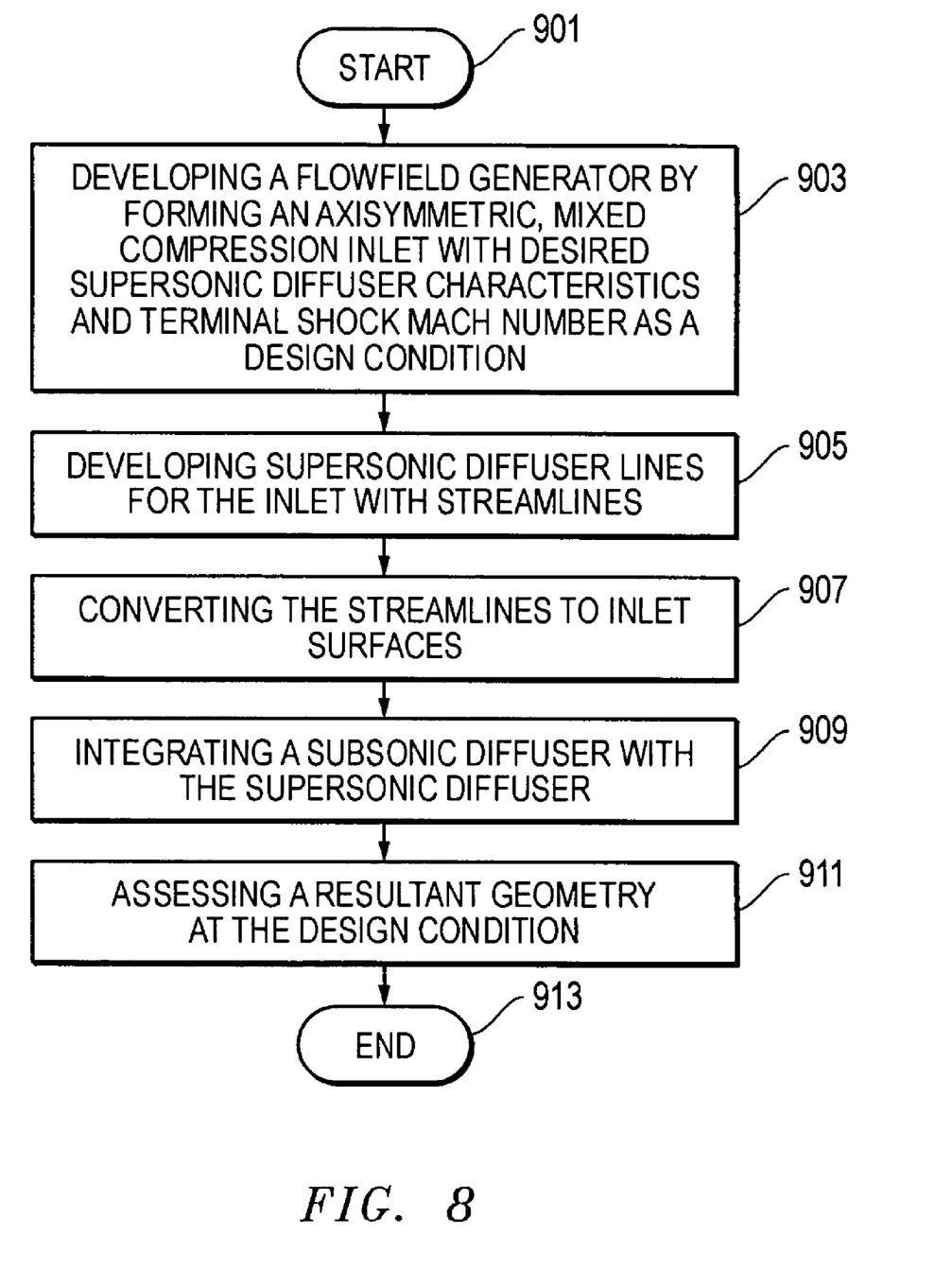
FIG. 8 is a high level flow diagram of one embodiment of a method constructed in accordance with the present invention.

Referring now to FIG. 8, one embodiment of a method of designing a three-dimensional, mixed compression inlet for an aircraft engine is disclosed. The method starts as indicated at step 901, and comprises developing a flowfield generator by forming an axisymmetric, mixed compression inlet with desired supersonic diffuser characteristics and terminal shock Mach number as a design condition (step 903); developing supersonic diffuser lines for the inlet with streamlines (step 905); converting the streamlines to inlet surfaces (step 907); integrating a subsonic diffuser with the supersonic diffuser (step 909); and then assessing a resultant geometry at the design condition (step 911); before ending as indicated at step 913.

The present invention is an enabling high speed propulsion technology that may be used on global strike type tactical and strategic weapons systems requiring long range, high speed cruise in a high threat environment. Although the AAI is somewhat related to diverterless supersonic inlets (DSI) (see U.S. Pat. Nos. 5,749,542 and 5,779,189), the DSI is an external compression inlet concept in which the external compression surface is developed by streamline tracing from a simple conical flow field generator. For the AAI, both the external and internal compression surfaces (i.e., the entire supersonic diffuser) are traced from an axisymmetric inlet flow field generator. Thus, the AAI extends the principles used in developing the DSI to a mixed compression inlet designed for higher supersonic cruise Mach numbers.

The present invention has several advantages, including the ability to use streamline tracing of a supersonic diffuser for alternate aperture shaping while producing easily understood and predictable mixed compression inlet performance. The present technique allows for the design of edge-aligned, swept aperture shapes without incurring the aerodynamic penalties typically encountered with such designs. By producing a design from a desired solution, the performance is readily predicted using simple one-dimensional methods. Moreover, because the design is based on an axisymmetric inlet, the cowl angles are relatively shallow, allowing for low drag integration. The AAI has been computationally proven through CFD to produce uniform flow at the throat with the predicted terminal Mach number.

While the invention has been shown or described in only some of its forms, it should be apparent to those skilled in the art that it is not so limited, but is susceptible to various changes without departing from the scope of the invention.

What is claimed is:

1. A method of designing a three-dimensional, mixed compression inlet for an aircraft engine, the method comprising:

(a) developing a flowfield generator by forming an axisymmetric, mixed compression inlet with desired supersonic diffuser characteristics and terminal shock Mach number as a design condition;
(b) developing supersonic diffuser lines for the inlet with streamlines;
(c) converting the streamlines to inlet surfaces;
(d) integrating a subsonic diffuser with the supersonic diffuser; and then
(e) assessing a resultant geometry at the design condition.

2. A method according to claim 1, wherein step (a) further comprises obtaining a computational fluid dynamics (CFD) solution with slip wall boundaries at a desired condition, step (c) further comprises converting CFD streamline traces, and step (e) further comprises using CFD with slip wall boundaries to assess the resultant geometry.

3. A method according to claim 1, wherein step (b) further comprises projecting a desired aperture shape onto an external shock wave, and forming the streamlines from points along a projection of the aperture.

4. A method according to claim 1, wherein step (c) further comprises defining the supersonic diffuser with the streamlines from a throat of the flowfield generator forward to an aperture of the inlet.

5. A method according to claim 1, wherein step (e) further comprises verifying that characteristics of the supersonic diffuser are consistent with the flowfield generator.

6. A method according to claim 1, further comprising forming the inlet with a three-dimensional, non-axisymmetric aperture.

7. A method of designing a three-dimensional, mixed compression inlet for an aircraft engine, the method comprising:
(a) developing a flowfield generator by forming an axisymmetric, mixed compression inlet with desired supersonic diffuser characteristics and terminal shock Mach number as a design condition;
(b) developing supersonic diffuser lines for the inlet with streamlines;
(c) converting the streamlines to inlet surfaces by defining the supersonic diffuser with the streamlines from a throat of the flowfield generator forward to an aperture of the inlet;
(d) integrating a subsonic diffuser with the supersonic diffuser; and then
(e) assessing a resultant geometry at the design condition having a three-dimensional, non-axisymmetric aperture to verify that characteristics of the supersonic diffuser are consistent with the flowfield generator.

8. A method according to claim 7, wherein step (a) further comprises obtaining a computational fluid dynamics (CFD) solution with slip wall boundaries at a desired condition, step (c) further comprises converting CFD streamline traces, and step (e) further comprises using CFD with slip wall boundaries to assess the resultant geometry.

9. A method according to claim 7, wherein step (b) further comprises projecting a desired aperture shape onto an external shock wave, and forming the streamlines from points along a projection of the aperture.

10. A method of designing a three-dimensional, mixed compression inlet for an aircraft engine, the method comprising:
(a) developing a flowfield generator by forming an axisymmetric, mixed compression inlet with desired supersonic diffuser characteristics and terminal shock Mach number as a design condition, and obtaining a computational fluid dynamics (CFD) solution with slip wall boundaries at a desired condition;
(b) developing supersonic diffuser lines for the inlet with CFD streamline traces by projecting a desired aperture shape onto an external shock wave, and forming the streamlines from points along a projection of the aperture;
(c) converting the CFD streamline traces to inlet surfaces by defining the supersonic diffuser with the streamlines from a throat of the flowfield generator forward to an aperture of the inlet;
(d) integrating a subsonic diffuser with the supersonic diffuser; and then
(e) assessing a resultant geometry including a three-dimensional, non-axisymmetric aperture by CFD with slip wall boundaries at the design condition to verify that characteristics of the supersonic diffuser are consistent with the flowfield generator.

* * * * *